United States Patent
Gong et al.

(10) Patent No.: US 9,138,899 B2
(45) Date of Patent: Sep. 22, 2015

(54) SUCTION DEVICE

(71) Applicants: SHENZHEN FUTAIHONG PRECISION INDUSTRY CO., LTD., Shenzhen (CN); FIH (Hong Kong) Limited, Kowloon (HK)

(72) Inventors: Xu Gong, Shenzhen (CN); Bing Yu, Shenzhen (CN); Jian-Ping Jin, Shenzhen (CN)

(73) Assignees: SHENZHEN FUTAIHONG PRECISION INDUSTRY CO., LTD., Shenzhen (CN); FIH (HONG KONG) LIMITED, Kowloon (HK)

( * ) Notice: Subject to any disclaimer, the term of this patent is extended or adjusted under 35 U.S.C. 154(b) by 0 days.

(21) Appl. No.: 14/518,156

(22) Filed: Oct. 20, 2014

(65) Prior Publication Data
US 2015/0137545 A1    May 21, 2015

(30) Foreign Application Priority Data
Nov. 15, 2013 (CN) .......................... 2013 1 0568392

(51) Int. Cl.
*A47J 45/00*    (2006.01)
*B25J 15/06*    (2006.01)

(52) U.S. Cl.
CPC ................................. *B25J 15/0616* (2013.01)

(58) Field of Classification Search
CPC ...... B25J 15/0616; B66C 1/02; B25B 11/007; H01L 21/6838
See application file for complete search history.

(56) References Cited

U.S. PATENT DOCUMENTS

| | | | | |
|---|---|---|---|---|
| 4,796,357 | A * | 1/1989 | Smith | 29/840 |
| 6,240,628 | B1 * | 6/2001 | Yoshida et al. | 29/740 |
| 7,222,901 | B2 * | 5/2007 | Gebauer et al. | 294/183 |
| 8,550,524 | B2 * | 10/2013 | Yeh et al. | 294/183 |
| 2002/0185875 | A1 * | 12/2002 | Kim | 294/64.1 |

* cited by examiner

*Primary Examiner* — Stephen Vu
(74) *Attorney, Agent, or Firm* — Novak Druce Connolly Bove + Quigg LLP

(57) ABSTRACT

A suction device includes a suction head, a fixing assembly, a rotating assembly, and a sliding assembly. The rotating assembly includes a shaft defining a spiral sliding slot. The suction head is attached to an end of the shaft. The sliding assembly is slidable and attached to the fixing assembly and includes a guiding post. An end of the guiding post is slidable and received in the spiral sliding slot. The sliding assembly is able to slide relative to the fixing assembly to slide the guiding post along the spiral sliding slot, thereby urging the shaft together with the suction head to rotate.

4 Claims, 4 Drawing Sheets

SUCTION DEVICE

FIELD

The present disclosure relates to suction devices.

BACKGROUND

In assembly of electronic devices, such as mobile phones, multiple labels usually need to be adhered to components of the electronic devices.

BRIEF DESCRIPTION OF THE DRAWINGS

Implementations of the present technology will now be described, by way of example only, with reference to the attached figure.

DETAILED DESCRIPTION

Figure 1:
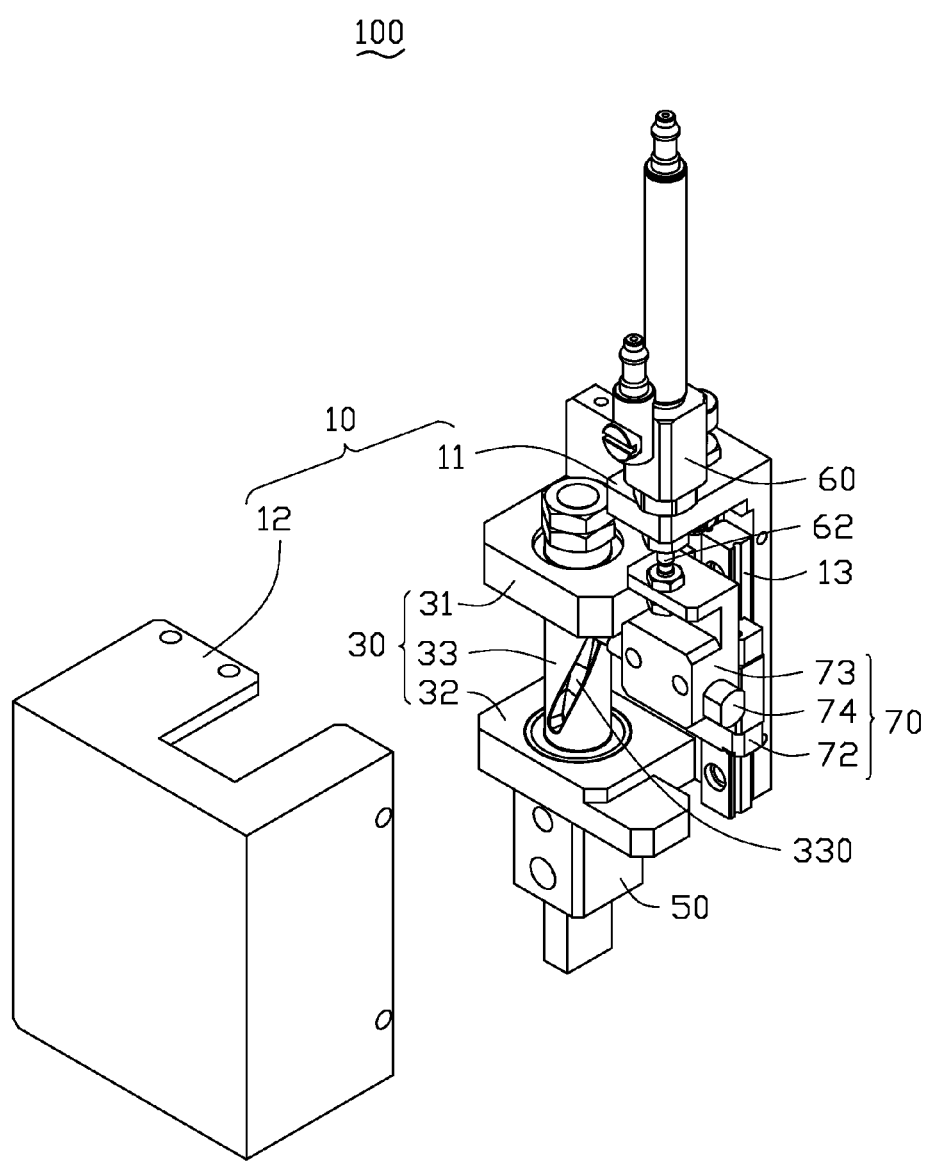
FIG. 1 is a partially exploded, isometric view of a suction device according to an exemplary embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

Figure 4:
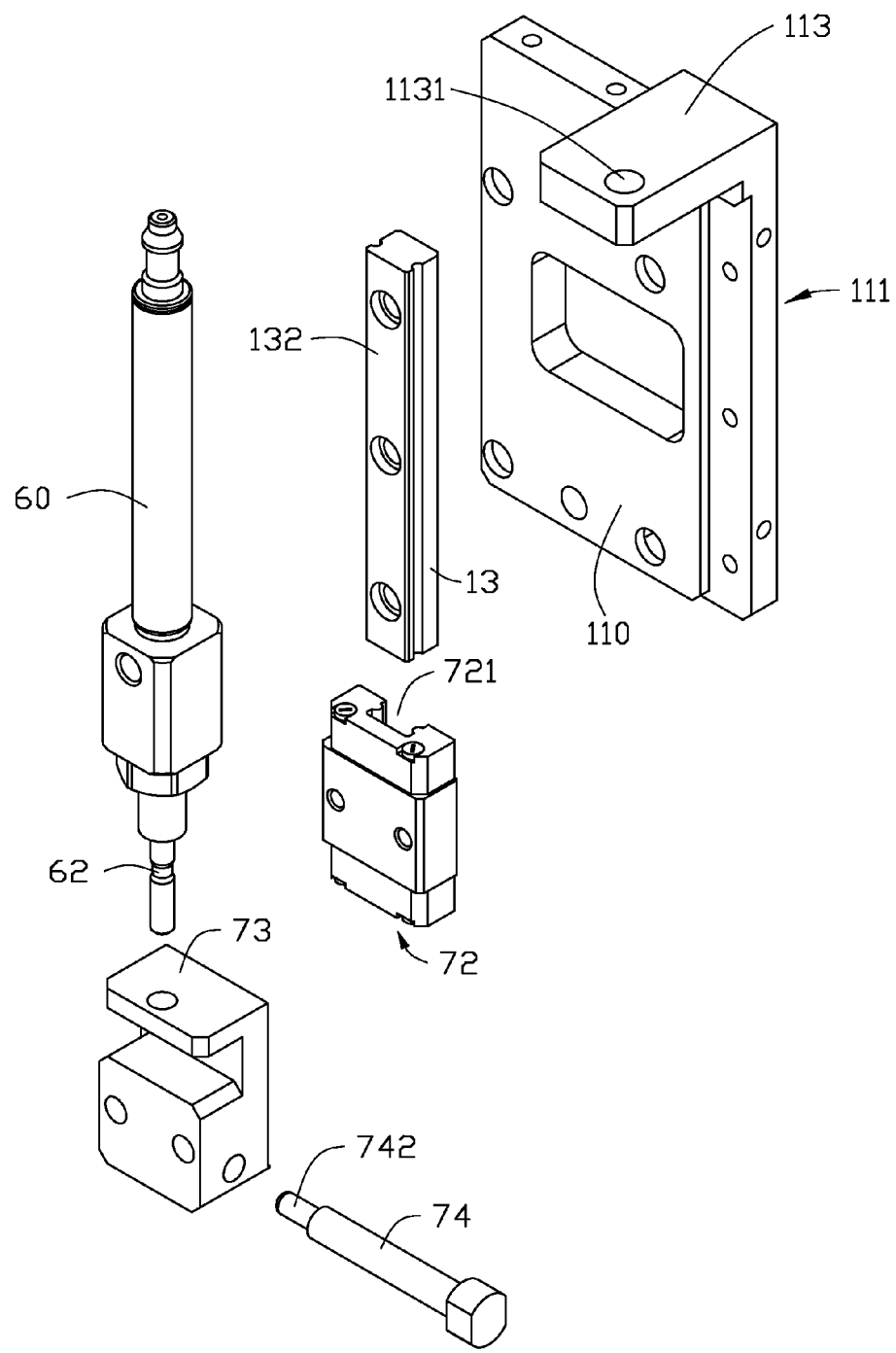
FIG. 4 is an exploded view of a sliding assembly of and the fixing assembly of the suction device of FIG. 1.

FIGS. 1 and 4 illustrate a suction device 100 for picking up objects such as labels and other elements. The suction device 100 comprises a suction head 50, a fixing assembly 10, a rotating assembly 30, and a sliding assembly 70.

The rotating assembly 30 comprises a shaft 33 defining a spiral sliding slot 330. The suction head 50 is attached to an end of the shaft 33 and is configured to releasably hold at least one object.

The sliding assembly 70 is attached to the fixing assembly 10 and comprises a guiding post 74. An end 742 of the guiding post 74 is slideable and received in the spiral sliding slot 330. The sliding assembly 70 is configured to slide relative to the fixing assembly 10 to slide the guiding post 74 along the spiral sliding slot 330, thereby urging the shaft 33 and the suction head 50 to rotate.

The fixing assembly 10 comprises a fixing board 11. The fixing board 11 comprises a first portion 110 and a second portion 113 extending substantially perpendicularly from an end of the first portion 110. A guiding block 13 is attached to the first portion 110. The guiding block 13 forms a sliding rail 132.

Figure 2:
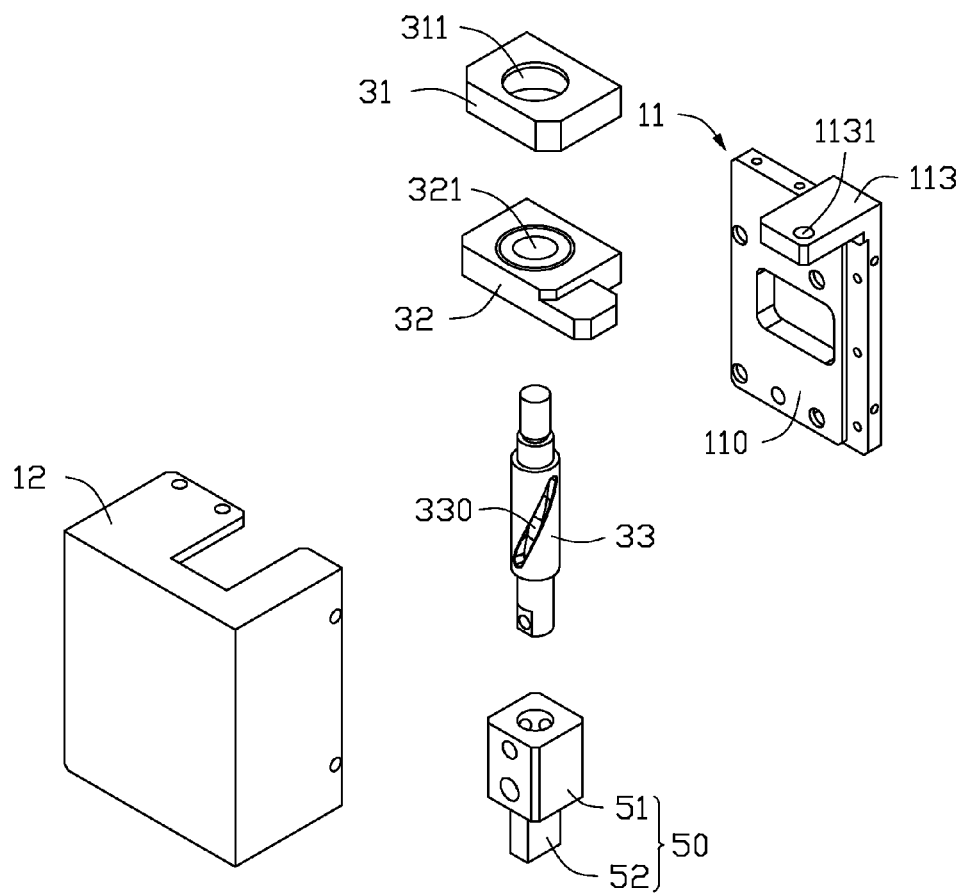
FIG. 2 is an exploded view of a fixing assembly and a rotating assembly of the suction device of FIG. 1.

FIG. 2 illustrates that the sliding assembly 70 further comprises a connecting block 72 and a sliding block 73. The connecting block 72 defines a sliding slot 721 engaged with the sliding rail 132. The connecting block 72 is slidably attached to the guiding block 13 through an engagement between the sliding slot 721 and the sliding rail 132. The sliding block 73 is secured to the connecting block 72 and configured to slide along the sliding rail 132 with the connecting block 72. The guiding post 74 is secured to the sliding block 73 and configured to move with the sliding block 73.

FIG. 1 illustrates that a driver 60 is secured to the second portion 113. The driver 60 can be a cylinder and has a driving shaft 62 inserted through a fixing hole 1131 defined in the second portion 113. The driving shaft 62 is connected to the sliding block 73, to drive the sliding block 73, the guiding post 74, and the connecting block 73 to slide along the sliding rail 132.

Figure 3:
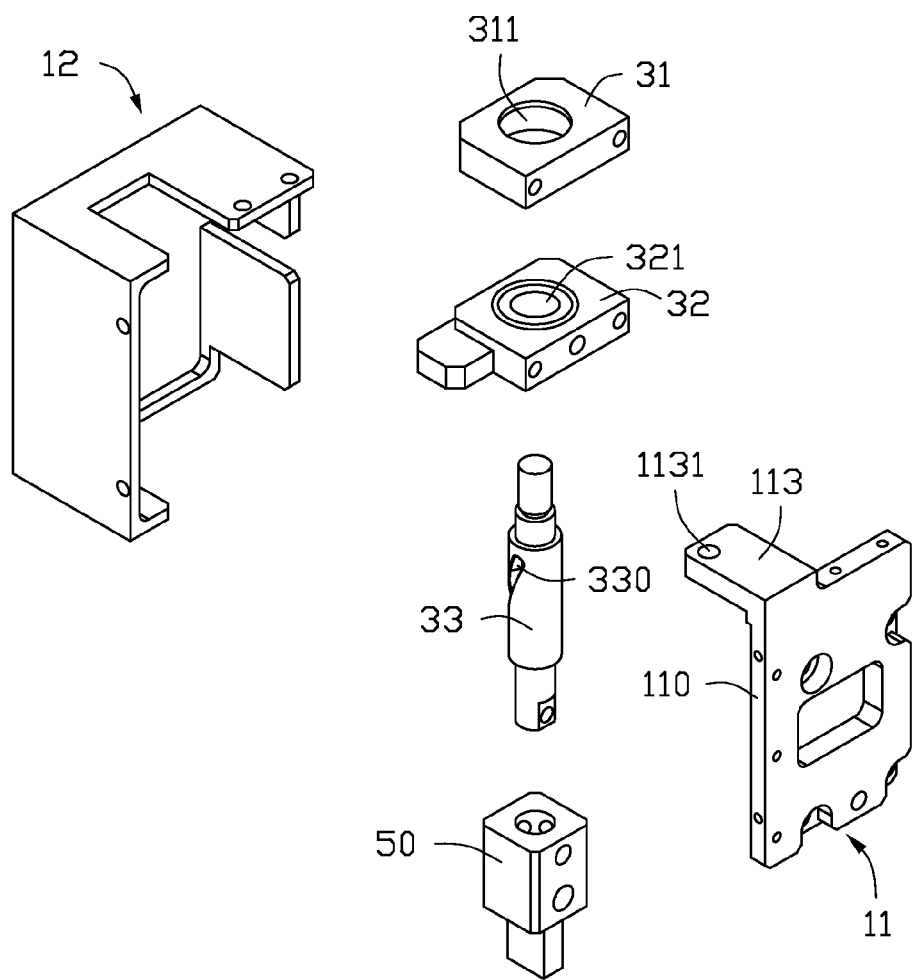
FIG. 3 is similar to FIG. 2, but viewed from another angle.

FIGS. 2 and 3 illustrate that the rotating assembly 30 further comprises a first mounting plate 31 and a second mounting plate 32 both secured to the first portion 110. The first mounting plate 31 and the second mounting plate 32 are spaced and substantially parallel to each other. The first mounting plate 31 defines a first mounting hole 311 and the second mounting plate 32 defines a second mounting hole 321. The shaft 33 is rotatably inserted through the first and second mounting hole 311, 321, thereby rotatably secured to the first and second mounting plate 31, 32, with the spiral sliding slot 330 positioned between the first and second mounting plate 31, 32. The spiral sliding slot 330 is spirally defined in the shaft 33. The suction head 50 is secured to the end of the shaft 33 away from the first mounting plate 31.

The suction head 50 is configured to apply suction to objects. The suction head 50 is connected to a vacuum pump (not shown) to create a vacuum inside the suction head 50, thereby enabling the objects to be absorbed by the suction head 50.

The fixing assembly 10 further comprises an protective frame 12. The protective frame 12 engages the fixing board 11 to enclose the rotating assembly 30 and the sliding assembly 70.

The embodiments shown and described above are only examples. Many details are often found in the art such as the other features of a suction device. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A suction device comprising:
   a suction head configured to releasably hold at least one object;
   a rotating assembly comprising a shaft defining a spiral sliding slot and having an end configured to receive the suction head;
   a sliding assembly slidably attached to a fixing assembly and comprising a guiding post having an end configured to be slidably received in the spiral sliding slot, wherein the sliding assembly is configured to slide relative to the fixing assembly and to slide the guiding post along the spiral sliding slot, thereby urging the shaft to rotate together with the suction head;
   wherein the fixing assembly comprises a fixing board; a guiding block forming a sliding rail is attached to the fixing board; the sliding assembly further comprises a connecting block defining a sliding slot; the sliding assembly is slidably attached to the guiding block through an engagement between the sliding slot and the sliding rail;
   wherein the sliding assembly further comprises a sliding block secured to the connecting block and configured to slide along the sliding rail; the guiding post is secured to the sliding block and configured to move with the sliding block;
   a driver secured to the fixing board; the driver has a driving shaft connected to the sliding block, to drive the sliding block, the guiding post, and the connecting block to slide along the sliding rail; and
   wherein the driver is a cylinder.

2. The suction device of claim 1, wherein the fixing board comprises a first portion and a second portion extending substantially perpendicularly from an end of the first portion; the guiding block is secured to the first portion; the driver is secured to the second portion and the driving shaft is inserted through a fixing hole defined in the second portion.

3. The suction device of claim 2, wherein the rotating assembly further comprises a first mounting plate and a second mounting plate both secured to the first portion; the first mounting plate and the second mounting plate are spaced and substantially parallel to each other; the shaft is rotatably secured to the first and second mounting plate, with the spiral sliding slot positioned between the first and second mounting plate; the suction head is secured to an end of the shaft away from the first mounting plate.

4. The suction device of claim 3, wherein the first mounting plate defines a first mounting hole and the second mounting plate defines a second mounting hole; the shaft is rotatably inserted through the first and second mounting hole.

* * * * *